United States Patent
Aton et al.

Patent Number: 5,156,942
Date of Patent: Oct. 20, 1992

[54] EXTENDED SOURCE E-BEAM MASK IMAGING SYSTEM AND METHOD

[75] Inventors: Thomas J. Aton, Dallas, Tex.; Denis F. Spicer, Bedford, England

[73] Assignee: Texas Instruments Incorporated, Dallas, Tex.

[21] Appl. No.: 378,116

[22] Filed: Jul. 11, 1989

[51] Int. Cl.$^5$ .............................................. G03C 5/00
[52] U.S. Cl. .................................. 430/296; 430/942; 430/139
[58] Field of Search ............... 430/296, 942, 139; 250/492, 492.2, 491.1, 493.1

[56] References Cited

U.S. PATENT DOCUMENTS

| | | | |
|---|---|---|---|
| 4,356,254 | 10/1982 | Takahashi et al. | 430/945 |
| 4,425,423 | 1/1984 | Wang | 430/139 |
| 4,438,336 | 3/1984 | Riecke | 250/491.1 |
| 4,661,709 | 4/1987 | Walker et al. | 250/492.2 |

FOREIGN PATENT DOCUMENTS

2088084  11/1980  United Kingdom ............... 430/296

OTHER PUBLICATIONS

L. F. Thompson et al, Introduction to Microlithography, Mar. 20-25 1983, pp. 74-78.
R. Feder et al., Single Exposure System for Multilevel Metallurgy, Jan. 1975, vol. 17, No. 8, pp. 2460-2461.

*Primary Examiner*—Ellis P. Robinson
*Assistant Examiner*—J. Weddington
*Attorney, Agent, or Firm*—Ira S. Matsil; B. Peter Barndt; Richard L. Donaldson

[57] ABSTRACT

An electron beam imaging system (10) includes a photoemitter plate (12). An optical image beam (15) is directed through a pattern mask (18), which is imaged onto the photoemitter (12). The photoemitter (12) emits electrons from those unmasked regions illuminated by the optical image beam, emitting an extended-source electron beam that carries the mask image. The extended-source electron beam is focused (34) onto a device under fabrication (40), providing a single-stage electron lithographic patterning function. The optical source (16) is chosen so that the optical image beam energy is nearly identical to the work function for the photoemissive coating (14) of the photoemitter (12). As a result, the photoemitter (12) emits electrons with substantially zero kinetic energy, allowing the emitted electrons to be accelerated through the electron beam focusing elements (34) with very nearly identical electron velocities, thereby minimizing chromatic aberrations. In one embodiment, an aperture (85) is used to limit the extended-source electron beam to those electrons with trajectories requiring no more than a maximum amount of focusing, thereby minimizing spherical aberrations.

11 Claims, 1 Drawing Sheet

EXTENDED SOURCE E-BEAM MASK IMAGING SYSTEM AND METHOD

TECHNICAL FIELD OF THE INVENTION

This invention relates to integrated circuit fabrication, and more particularly to an electron beam mask imaging system and method using a spatially extended photoemitter source to provide a electron beam image of an integrated circuit pattern mask in a single exposure step.

BACKGROUND OF THE INVENTION

Photolithographic patterning techniques are commonly used in integrated circuit fabrication. Typically, ultraviolet light is transmitted through a photographic mask. The image of the mask is focused on the surface of an integrated circuit device under fabrication. The patterned light defines a spatially extended image that typically exposes a layer of photoresistive material formed on the surface of the device under fabrication. Using conventional integrated circuit fabrication techniques, the photoresistive layer, which has been exposed by the mask image, is then used to define etches or implants for subsequent fabrication steps.

Current photolithographic patterning systems for commercial integrated circuit fabrication use ultraviolet light (typically the I-line of mercury). Because an entire integrated circuit can be imaged with a single spatially extended image beam, these photolithographic patterning systems are referred to as photolithographic steppers.

As integrated circuits become more complex, the number of circuit elements increases and their size correspondingly decreases. As the circuit dimensions being patterned decrease, the resolution of a mask-image pattern must be increased. While the resolution of optical photolithographic patterning systems is being continually increased, patterning systems are available that achieve significantly greater image resolution than available (or likely to be available) from optical photolithographic patterning systems. One such patterning technique uses an electron beam that is scanned over the surface of a device under fabrication, and selectively blanked to create the desired pattern image.

Scanning electron beam patterning systems use a point source to create a narrow beam of electrons that is focused and scanned. These systems operate with wavelengths on the order of 10 nanometers, achieving significantly greater pattern-image resolution than is available from optical photolithographic systems that typically operate with wavelengths in the range of hundreds of nanometers.

The disadvantage of scanned e-beam patterning systems is that the scanning operation requires considerably more time to produce a pattern than the mask-stepping operation of optical photolithographic patterning systems. Consequently, despite the superior resolution available from scanned e-beam patterning systems, they are seldom used to directly write the patterns on commercial integrated circuits. Rather, these patterning systems are limited to fabricating prototypes or experimental devices, and to making the masks for conventional optical stepper systems.

Accordingly, a need exists for an extended source electron beam patterning system capable of imaging an entire pattern mask in a single-step operation. That is, a satisfactory electron beam imaging system would avoid scanning the electron beam.

SUMMARY OF THE INVENTION

The present invention provides improved through-put for an electron beam patterning system for integrated circuit fabrication, by providing an extended source electron beam that images an entire pattern on an integrated circuit under fabrication in a single step operation.

In one aspect, the extended source electron beam mask-imaging system includes a pattern mask and a photoemissive plate. A light source transmits an image beam through the mask to form the pattern image on the photoemissive plate. In its image-illuminated regions, the photoemissive plate emits electrons as a spatially extended source generating an electron beam that carries the entire mask-image. The resulting electron beam image of the pattern mask is focused on a device under fabrication to form a corresponding pattern on the device. Conventional electron beam techniques are used to focus the extended-source e-beam.

In its more specific aspects, the extended-source electron beam pattern imaging system uses an optical imaging source and a photoemissive source selected so that the optical energy is almost identical to the work function of the photoemitter. As a result, the photoemitter emits electrons with very nearly zero kinetic energy so that chromatic distortions in focusing the extended-source electron beam can be minimized by uniformly accelerating the emitted electrons before passing through the electron beam focusing elements.

Spherical aberrations can be reduced by introducing an aperture between the photoemissive source and the electron optics that focus the electrons onto the integrated circuit under fabrication. This significantly improves resolution, while somewhat reducing through-put, thereby establishing a design trade-off between maximizing through-put and maximizing resolution.

The technical advantages of the extended source electron beam mask-imaging system of this invention include the following. The system uses a spatially extended electron beam that carries an entire mask-image, allowing stepper-mode patterning of a device under fabrication. The system uses an optical imaging source with a wavelength matched to the work function of the photoemitter, allowing electrons to be emitted with very nearly zero kinetic energy, thereby reducing chromatic aberrations resulting from accelerating and focusing the electron beam carrying the mask image. An aperture can be used to limit focusing angles, thereby decreasing spherical aberrations and increasing resolution.

BRIEF DESCRIPTION OF THE DRAWINGS

For a more complete understanding of the present invention, and for further features and advantages, reference is now made to the following Detailed Description, taken in conjunction with the accompanying Drawings, in which.

DETAILED DESCRIPTION OF THE INVENTION

The preferred embodiment of the extended source electron beam mask-imaging system of this invention is described in connection with two embodiments that represent a design trade-off between maximizing resolution and maximizing throughput. The preferred embodiment shown in FIG. 1 does not include an aperture, so that a substantial percentage of the photoemitted electrons are focused onto the integrated circuit device under fabrication, minimizing imaging time and maximizing through-put. An alternate embodiment shown in FIG. 2 includes an aperture inserted in the beam focusing path to transmit only those emitted electrons with trajectories defining focusing angles less than some predetermined maximum, thereby decreasing spherical aberration and increasing resolution, but at the expense of reduced through-put due to longer imaging times.

Figure 1:
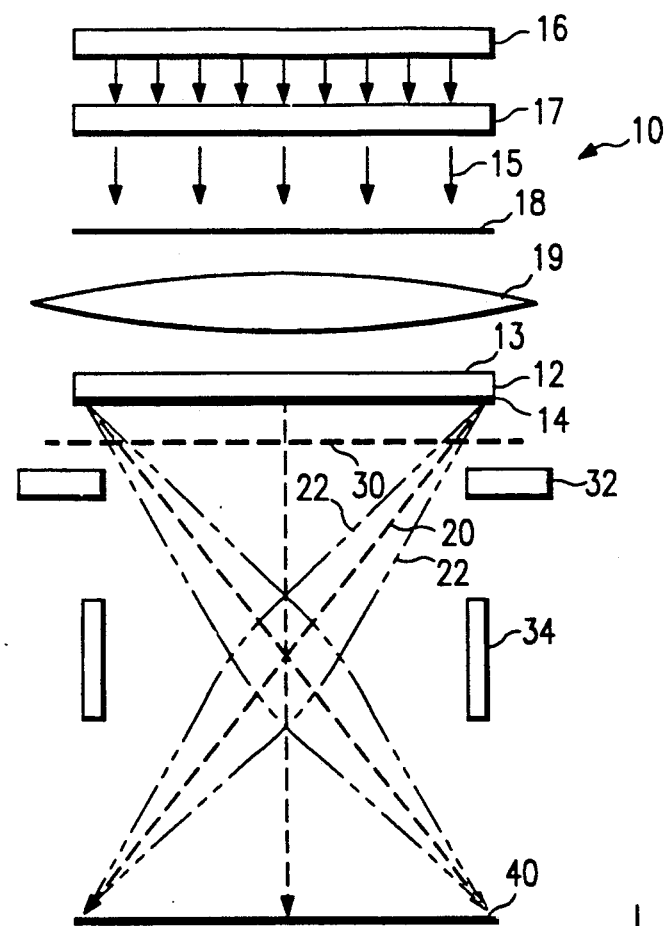
FIG. 1 diagrammatically shows the extended source electron beam mask-imaging system of the present invention.

As shown in FIG. 1, the extended source electron beam mask-imaging system 10 includes a photoemissive plate 12 formed from a transparent quartz plate 13, coated with a photoemissive layer 14.

Light 15 from an optical source 16 and appropriate imaging optics 17 is transmitted through an integrated circuit patterning mask 18. The resulting mask-image is focused by appropriate image optics 19 onto photoemissive plate 12. That is, the entire mask-image is applied to the extended-source photoemissive plate 12 in a single-step imaging operation.

In response to the incident mask-image carried by light 15, the photoemissive coating 14 of the photoemitter 12 emits electrons in the regions of the photoemissive coating that are illuminated by the mask-image beam, generating a spatially extended electron beam that carries the mask-image incident to the photoemissive plate.

In response to the incident mask-image from beam 15, electrons are emitted across the photoemissive plate 12, which in effect acts like an extended array (corresponding to the incident mask-image) of simultaneously excited point source electron emitters. From each point source emitter area of the photoemissive coating 14, electrons are emitted with a range of trajectories, represented by rays 20 and 22. These electrons are accelerated by appropriate electron accelerating elements, represented by a grid 30 and an anode 32 (the photoemitter 12 being the catrode). The accelerated electrons are focused by electron beam focusing elements, represented by electron lens element 34, onto the surface of a device under fabrication 40.

A conventional electron beam optics system includes a series of electron accelerating elements and magnetic focusing elements (lenses). The electron accelerating elements represented by grid 30 and anode 32 operate conventionally to accelerate the electrons emitted by the photoemissive coating to a desired energy level (such as 50 KeV) for proper imaging resolution. Rapidly accelerating the emitted electrons away from the photoemissive plate is recommended to avoid space charge effects that impart undesired variable velocities to the emitted electrons. The electron beam focusing elements represented by element 34 perform a conventional electron beam focusing function. The precise configuration of the electron beam optics represented by the electron beam accelerating and focusing elements is a matter of design selection, and need not be described in detail.

The mask imaging source represented by optical source 16 and imaging optics 17, and the photoemitter 12 are selected such that the energy of the optical imaging light 15 (which is proportional to its wavelength) is approximately equal to the work function of the photoemissive coating 14. As a result, the photoemitter emits electrons with very nearly zero kinetic energy. These electrons are then accelerated away from the photoemitter by the electron accelerating elements (30, 32), maintaining substantially identical velocities through the electron beam focusing elements (34).

The complementary selection of a mask imaging source and a photoemissive material to produce emitted electrons with very nearly zero kinetic energy is important in reducing chromatic aberrations. Electrons emitted with different velocities are focused differently by electron beam focusing elements. Analogous to optical lenses, the focal length of the electron beam focusing elements (or lenses) is a function of the speed of the electrons. Emitting electrons from the photoemitter 14 with almost identical initial velocities, and then accelerating them uniformly across the extended source (i.e., across the photoemitter), provides electrons with very nearly identical velocities through the electron beam focusing elements, thereby minimizing chromatic aberrations.

For example, a gold photoemissive coating and an Nd:YAG laser can be used to generate electrons with substantially zero kinetic energy. An Nd:YAG (Neodymium:Yyterbium/Aluminum/Garnet) laser generates light with a wavelength of 1064 nanometers. When transmitted through two frequency-doubling elements (in imaging optics 17) coherent imaging light is available at 266 nanometers. A 266-nanometer imaging light is substantially identical in energy to the work function of the gold photoemissive coating. As a result, in response to an incident mask-image, electrons would be emitted from the illuminated regions of the photoemissive coating with very nearly zero kinetic energy. Other combinations of specific optical imaging sources with wavelengths that match the work function of other photoemissive materials could be substituted as long as the match between photon energy and the work function of the material is good.

The use of an Nd:YAG laser in connection with a gold photoemitter is described in detail in P. May et al., *Picosecond Photoelectron Scanning Electron Microscope for Non-contact Testing of Integrated Circuits*, Vol. 51, No. 2, July, 1987 (p. 145). As the title indicates, the application discussed in that reference is for a scanning electron beam.

Another aberration that must be considered in designing an electron beam focusing system is the problem of spherical aberration.

Typically, in electron beam systems, extended sources are difficult to use because of large spherical aberration coefficients associated with fast (high ratio of effective lens aperture to focal length) electron beam lenses. That is, analogous to optical systems, spherical aberration results from focusing electrons with trajectories that do not pass through the center of an electron beam focusing element (lens). Thus, while electrons with the trajectory 20 will be focused without any significant spherical aberration, electrons from the same photoemissive point source with trajectories 22 will be focused to a slightly different point (spherical aberration).

By appropriate selection of the electron beam focusing elements 34, the amount of spherical aberration can be reduced but never entirely eliminated. However, any remaining spherical aberration adversely affects resolution of the focused image. Accordingly, to achieve a minimum degree of spherical aberration, it may be necessary to employ an aperture in the electron beam path to block electrons requiring focusing angles greater than some predetermined maximum.

Figure 2:
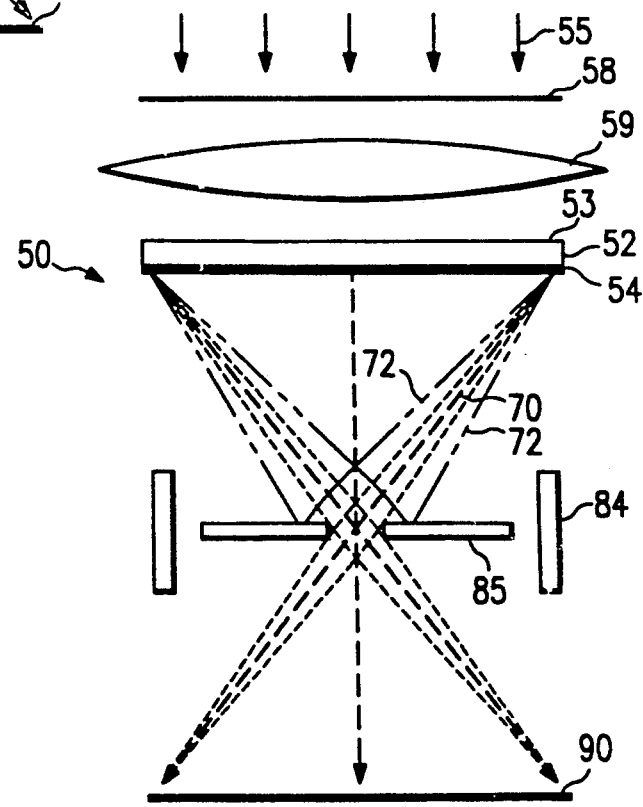
FIG. 2 diagrammatically shows the electron beam system, including an aperture.

FIG. 2 illustrates an alternative embodiment of the electron beam mask-imaging system, including an aperture to reduce spherical aberration. FIG. 2 shows a mask-imaging system 50 that includes a photoemissive plate 52 and a mask 58. An optical imaging beam 55 transmits through pattern mask 58 and the mask-image is focused by optics 59 onto the photoemissive plate 52 formed from a transparent quartz plate 53 coated with a photoemissive layer 54.

Photoemissive plate 52 emits electrons as a spatially extended source comprising an array of point sources defined by regions illuminated by the incident mask-image. The emitted electrons are focused by electron beam focusing elements represented by element 72, onto the surface of a device under fabrication 90. (The accelerating elements are not illustrated.)

An aperture 85 is included in the path of the emitted electrons. Aperture 85 functions to block electrons emitted with trajectories that require focusing angles greater than a predetermined maximim. Thus, aperture 85 allows emitted electrons with a trajectory 70 to pass through the electron beam focusing elements 72, while electrons with a trajectory 71 are blocked. In this manner, aperture 85 functions to insure that the emitted electrons that are focused to form the pattern are those with trajectories through the central portion of electron beam focusing elements 72, thereby minimizing spherical aberration.

Using an aperture 85 to minimize spherical aberration maximizes the pattern resolution available from the mask image carried by the electron beam focused onto the device under fabrication. The design trade-off, however, is that a substantial percentage of the electrons in the electron beam emitted by the extended-source photoemissive plate 52 are blocked by aperture 85. As a result, imaging time is substantially increased, and through-put (i.e., the number of devices produced per unit time) is reduced.

This Detailed Description has not been burdened with design details known to those skilled in the art. Thus, referring to FIG. 1, the details of the various optical elements used to generate, direct and focus collimated light beam 15, which are represented by beam optics 17 and lens 19, are available commercially and have not been described. Also, the details of elements for accelerating and focusing the emitted electrons function in accordance with conventional e-beam imaging equipment, and need not be described in detail.

In summary, the extended-source electron beam mask-imaging system allows an integrated circuit under fabrication to be patterned in a single-step mask-imaging operation that combines the resolution of an electron beam patterning system with the fabrication through-put obtainable from stepper operations using extended source mask-imaging rather than point source scanning. Chromatic distortions in the electron beam focusing operation are reduced by selecting a complementary light source and photoemissive material (such as an Nd:YAG laser source with a gold photoemitter) to provide photoemitted electrons with very nearly zero kinetic energy. A desired design trade-off between through-put and resolution is achievable through the selective introduction of an aperture in the electron beam focusing path to control spherical aberration. The resulting extended-source electron beam image carrying the mask-image is focused on the surface of an integrated circuit under fabrication to create a corresponding pattern with a specified resolution.

Although the present invention has been described with respect to a specific, preferred embodiment, various changes and modifications may be suggested to one skilled in the art, and it is intended that the present invention encompass such changes and modifications as fall within the scope of the appended claims.

What is claimed is:

1. A method of imaging a mask pattern on a device under fabrication using electron lithographic patterning, comprising the steps:

directing an optical image beam through a mask defining a mask pattern, which in turn creates an unmasked image beam, onto a photoemissive source, wherein said photoemissive source is provided for emitting electrons in response to said image beam;

in response to said image beam, said photoemissive source generating an extended-source electron beam defined by electrons emitted from those regions of said photoemissive source on which the unmasked image beam is incident;

focusing said extended-source electron beam onto the device under fabrication such that the mask pattern is imaged onto the device; and accelerating said extended-source electron beam away from said photoemissive source such that the electrons in said extended-source electron beam maintain substantially identical velocities during the focusing step.

2. The method of claim 1, wherein the energy of said optical image beam is substantially identical to the work function of said photoemissive source.

3. The method of claim 2, wherein:

the image beam comprises light from an Nd:YAG laser frequency-quadrupled to provide a wavelength of about 266 nanometers; and said photoemissive source comprises gold.

4. The method of claim 1, further comprising the step of transmitting said extended-source electron beam emitted from said photoemissive source through an aperture element that blocks electrons emitted with trajectories requiring more than a selected maximum amount of focusing.

5. The method of claim 2, further comprising the step of transmitting said extended-source electron beam emitted from said photoemissive source through an aperture element that blocks electrons emitted with trajectories requiring more than a selected maximum amount of focusing.

6. A method for patterning a device under fabrication comprising:

providing a light source for generating an optical image beam;

providing a photolithographic mask that defines a pattern to be used in fabricating the device;

providing a substantially planar photoemissive source responsive to the image beam from said light source for emitting electrons;

directing said optical image beam through said mask onto said photoemissive source, thereby imaging onto said photoemissive source the pattern defined by said mask;

said photoemissive source emitting a spatially extended electron beam carrying the mask-image defined by the unmasked portions of the incident image beam; and focusing said extended-source electron beam onto the device thereby providing a pattern on the device corresponding to the mask-image carried by said extended-source electron beam.

7. The method of claim 6, wherein said light source generates an optical image beam with photon energy substantially identical to the work function of said photoemissive source.

8. The method of claim 7, further including the step of accelerating electrons emitted from said photoemissive source away from said source and through said electron beam focusing means with substantially identical electron velocities.

9. The method of claim 8, wherein:
said light source comprises an Nd:YAG laser source and a frequency-quadrupling element, thereby providing coherent light with a wavelength of about 266 nanometers; and
said photoemissive source comprises gold.

10. The method of claim 6, wherein said focusing step includes using an aperture having a central hole for blocking electrons with trajectories that require more than a selected maximum focusing angle.

11. The method defined in claim 10, further including the step of accelerating emitted electrons at a nearly uniform rate of acceleration across the extended electron source.

* * * * *